United States Patent
Falk et al.

(10) Patent No.: US 12,414,428 B2
(45) Date of Patent: Sep. 9, 2025

(54) POLARITON QUANTUM DOTS COMPRISING ULTRASHORT CARBON NANOTUBES

(71) Applicant: INTERNATIONAL BUSINESS MACHINES CORPORATION, Armonk, NY (US)

(72) Inventors: Abram L. Falk, Port Chester, NY (US); Damon Brooks Farmer, White Plains, NY (US); Anil Yuksel, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 726 days.

(21) Appl. No.: 17/555,488

(22) Filed: Dec. 19, 2021

(65) Prior Publication Data
US 2023/0200098 A1    Jun. 22, 2023

(51) Int. Cl.
  *H10K 50/115*   (2023.01)
  *B82Y 20/00*    (2011.01)
  *H10K 71/00*    (2023.01)
  *H10K 85/20*    (2023.01)

(52) U.S. Cl.
  CPC .......... *H10K 50/115* (2023.02); *B82Y 20/00* (2013.01); *H10K 71/00* (2023.02); *H10K 85/221* (2023.02)

(58) Field of Classification Search
  CPC .................................................. H10K 85/221
  See application file for complete search history.

(56) References Cited

U.S. PATENT DOCUMENTS

| | | |
|---|---|---|
| 10,209,186 B2 | 2/2019 | Afzali-Ardakani et al. |
| 10,340,459 B2 | 7/2019 | Falk et al. |
| 10,459,257 B2 | 10/2019 | Rupasinghe et al. |
| 10,620,504 B2 | 4/2020 | Jain |
| 10,727,431 B2 | 7/2020 | Falk et al. |
| 11,139,442 B2 | 10/2021 | Fusella et al. |
| 11,820,663 B2 | 11/2023 | Falk et al. |
| 2007/0119496 A1 | 5/2007 | Baldo et al. |
| 2010/0075145 A1 | 3/2010 | Joo et al. |

OTHER PUBLICATIONS

"Reflection phase shift of one-dimensional plasmon polaritons in carbon nanotubes" by Luo et al. (Year: 2020).*
"Surface plasmon polariton amplification in a single-walled carbon nanotube" by Kadochkin et al. (Year: 2017).*
"Near-infrared exciton-polaritons in strongly coupled single-walled carbon nanotube microcavities" by Graf et al. (Year: 2016).*

(Continued)

*Primary Examiner* — Evren Seven
(74) *Attorney, Agent, or Firm* — Amin, Turocy & Watson, LLP

(57) ABSTRACT

A nanotube polariton quantum dot photon source device includes a substrate. A nanotube is arranged on the substrate, and an incident light source is configured to generate an exciton-plasmon polariton excitation in the nanotube. The nanotube emits a photon in response to the generated exciton plasmon polariton excitation. The nanotube has a length $L<50$ nm to emit one or more photons at a desired frequency.

20 Claims, 9 Drawing Sheets

(56) References Cited

OTHER PUBLICATIONS

Ho, P. et al., "Intrinsically Ultrastrong Plasmon-Exciton Interactions in Crystallized Films of Carbon Nanotubes"; PNAS (2018); vol. 115:50, pp. 12662-12667.
Chiu, K. et al., "Strong and Broadly Tunable Plasmon Resonances in Thick Films of Aligned Carbon Nanotubes"; Nano Letters (2017); vol. 17; pp. 5641-5645.
Falk, A. et al., "Coherent Plasmon and Phonon-Plasmon Resonances in Carbon Nanotubes"; Physical Review Letters (2017); 6 pgs.

\* cited by examiner

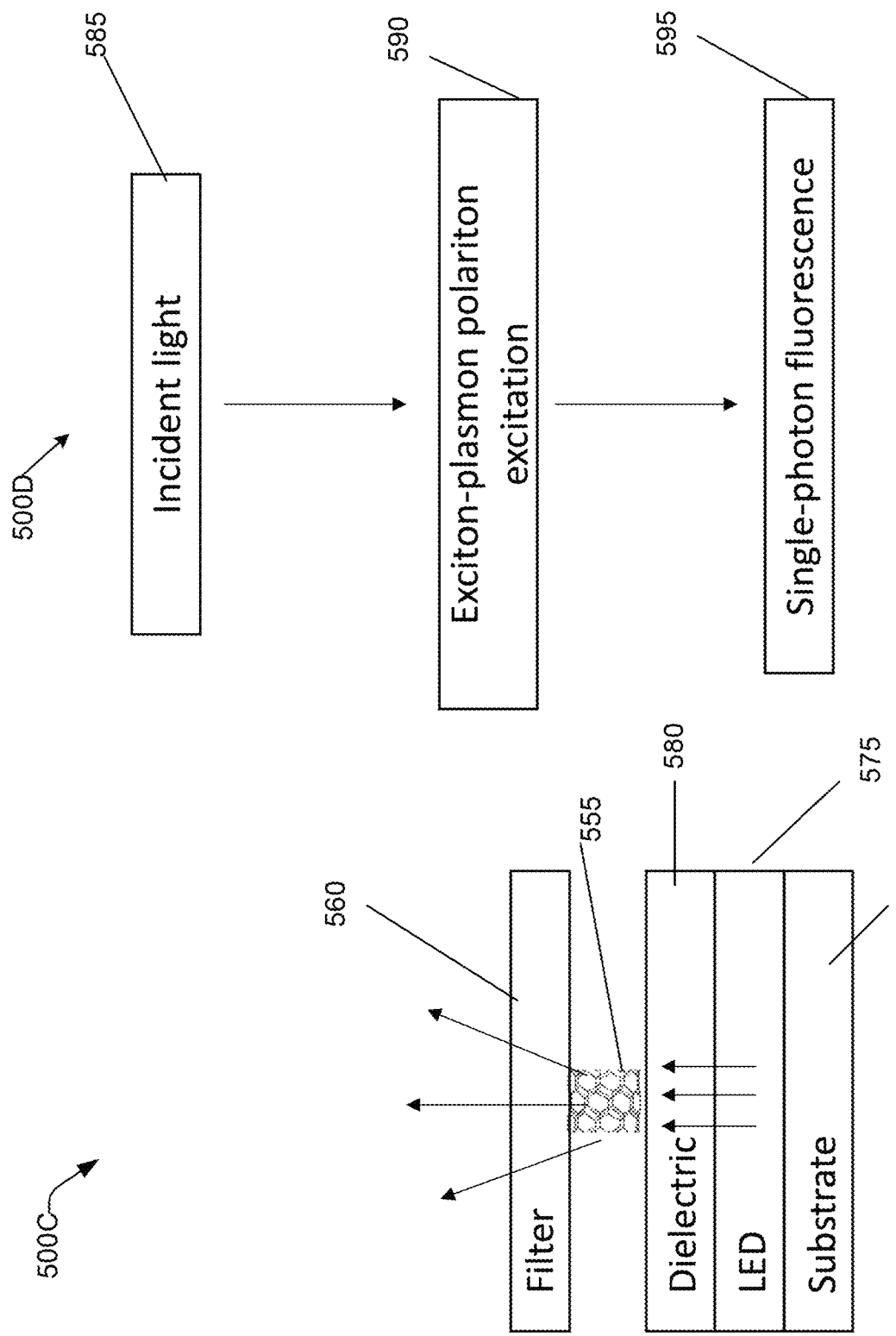

POLARITON QUANTUM DOTS COMPRISING ULTRASHORT CARBON NANOTUBES

BACKGROUND

Technical Field

The present disclosure generally relates to structures associated with optoelectronic phenomena, and more particularly, to polariton quantum dots and polariton devices.

Description of the Related Art

Surface plasmons and excitons are important optoelectronic phenomena. Surface plasmons are longitudinal-charge oscillations coupled to optical fields. The efficiency of photodetectors can be enhanced by using the surface plasmons to concentrate optical fields into nanoscale volumes. The concentration of optical fields can also serve to enhance the efficiency of photodetectors. In addition, the concentration of optical fields can serve to enhance the rate of luminescence of nearby optically or electrically driven emitters.

Excitons are electrons bound to electron holes in semiconductors. Excitons are used for both photoemission and photodetection, particularly in organic molecules. Surface plasmons can hybridize with nearby excitons to create a resultant quasiparticle known as a plasmon-exciton polariton. As metal surfaces are a most common host for surface plasmons, molecules are often placed near metal surfaces, or metal antennas. This type of plasmon-exciton polariton is known as a hybrid polariton, because the plasmon and exciton that form the polariton are hosted by separate materials.

SUMMARY

In one embodiment, a nanotube polariton quantum dot photon source device includes a substrate. A nanotube is arranged on the substrate, and an incident light source is configured to generate an exciton-plasmon polariton excitation in the nanotube. The nanotube emits a photon in response to the generated exciton plasmon polariton excitation. The nanotube has a length $L<50$ nm to emit one or more photons at a desired frequency.

In an embodiment, the desired frequency is an infrared frequency.

In an embodiment, the desired frequency is a near-infrared frequency.

In an embodiment, a diameter of the nanotube is about 1.5 nm.

In an embodiment, the incident light source is a laser arranged above a surface of the substrate on which the nanotube is arranged.

In an embodiment, the incident light source is a light emitting diode (LED) fabricated on the surface of the substrate. A filter is arranged above a surface of the substrate on which the nanotube is arranged. The filter is configured to absorb incident light emitted from the LED and to pass a photon emission from the nanotube during exciton-plasmon polariton excitation.

In an embodiment, the LED is arranged below the nanotube.

In an embodiment, the photon emission from the nanotube is a single-photon fluorescence.

In an embodiment, a dielectric layer is arranged on the substrate and capacitively coupled to one end of the nanotube.

In one embodiment, a nanotube polariton quantum dot photon source device includes a substrate, and a nanotube arranged on the substrate. One or more electrodes are connected to the nanotube, and the nanotube has a length $L<50$ nm.

In an embodiment, the nanotube is configured to emit single photons by electroluminescence when a pulsed voltage or a current is applied to the one or more electrodes.

In an embodiment, the one or more electrodes include a first electrode and a second electrode, and the device further includes a first substantially radial end of the nanotube is arranged on a surface of the substrate. The nanotube is connected to each of the first electrode and the second electrode. The first electrode and the second electrode are configured to receive a voltage or a current via an external circuit, and the nanotube is configured to emit a single-photon fluorescence in response to the electrodes receiving a pulsed voltage or current.

In an embodiment, the one or more electrodes include a first electrode and a second electrode, and the device further includes that the nanotube is connected to each of the first electrode and the second electrode. An electrical gate is arranged on the substrate and configured to receive an applied voltage. A dielectric layer is arranged on the electrical gate, and the nanotube is capacitively coupled to the electrical gate via the dielectric.

In an embodiment, an emission frequency of the nanotube the electrical gate is tuned based on an amount of voltage applied to the electrical gate.

In an embodiment, a change in the degree of absorption of the nanotube is based on an amount of the voltage applied to the electrical gate.

In an embodiment, the charge density in the nanotube changes based on the amount of voltage applied to the electrical gate.

In an embodiment, a degree to which the nanotube exhibits a plasmonic character or an excitonic character is based on an amount of voltage applied to the electrical gate.

In an embodiment, an array of nanotubes are arranged on the substrate.

In an embodiment, a carbon nanotube dot quantum device includes a nanotube polariton optical resonator having two ends. A pair of tapered optical couplers, each optical coupler is connected at a tapered end to a respective one of the two ends of the nanotube polariton optical resonator. A pair of optical waveguides are coupled respectively to a non-tapered end of one tapered optical coupler.

In an embodiment, an electrostatic gate voltage is coupled to the nanotube polariton optical resonator.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition to or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIG. 5C is a nanotube polariton quantum dot, including a nanotube resting on a substrate and an incident light source, consistent with an illustrative embodiment.

FIG. 5D shows the sequence of operations of the nanotube polariton quantum dot shown in FIG. 5C, consistent with an illustrative embodiment.

DETAILED DESCRIPTION

Overview

Figure 1:
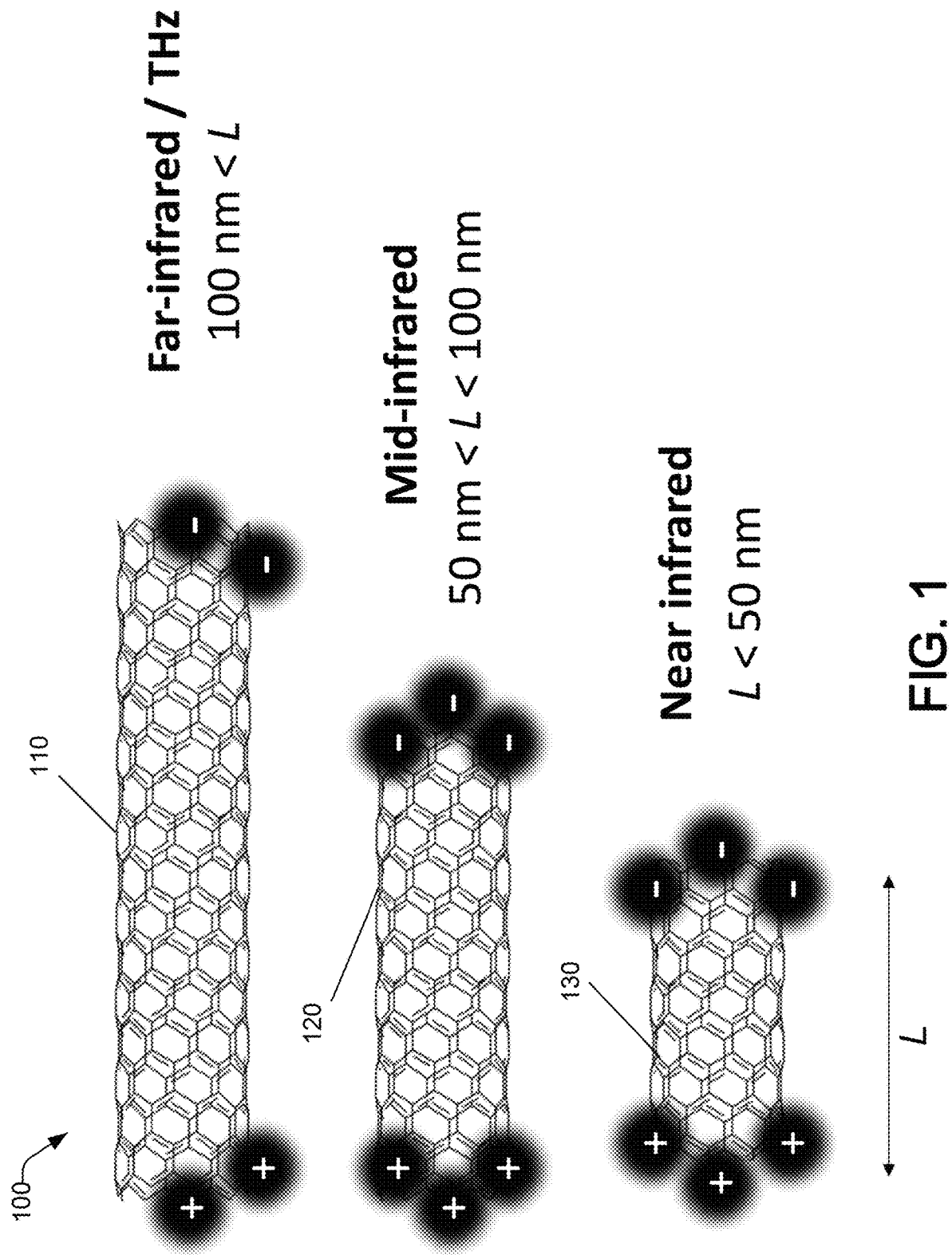
FIG. 1 is an overview of three nanotubes having different lengths, consistent with an illustrative embodiment consistent with an illustrative embodiment.

In the following detailed description, numerous specific details are set forth by way of examples to provide a thorough understanding of the relevant teachings. However, it should be understood that the present teachings may be practiced without such details. In other instances, well-known methods, procedures, components, and/or circuitry have been described at a relatively high level, without detail, to avoid unnecessarily obscuring aspects of the present teachings. It is to be understood that the present disclosure is not limited to the depictions in the drawings, as there may be fewer elements, or more elements, than shown and described.

As used herein, the term "ultrashort nanotube" typically refers to a length L<50 nm. However, it is to be understood that there can be ranges, for example, 45 nm to <50 nm, 40 nm to 50 nm, 35 nm to 50 nm, 40 nm to 45 nm, 35 nm to 45 nm, etc., that are within the scope of the present disclosure and the appended claims.

As used herein, the term "near-infrared" is a subset of the infrared band of the electromagnetic spectrum, covering the wavelengths ranging from 0.7 μm to 1.4 μm (700 to 1400 nm).

Carbon nanotubes are a particularly suitable material for surface plasmons. The nanoscale diameters of such carbon nanotubes can be as small as about 1.5 nm in diameter, which enables the concentration of optical fields to be approximately the same area. The small area provides a strengthening of light-matter interactions. Nanotubes can be provided as uniform resonators by etching thin and thick films with an increased quality factor (Q) of the resonance.

Dense ensembles of carbon nanotubes can form intrinsic plasmon-exciton polaritons. For example, the excitons of the nanotubes can hybridize with the surface plasmons of the nanotubes themselves. In such a case, the exciton-plasmon coupling has an ensemble effect.

According to the present disclosure, it has been discovered that when carbon nanotubes are etched into very short lengths (e.g., less than <50 nm), there are unique optical properties that occur.

FIG. 1 is an overview 100 of three nanotubes of different lengths, consistent with an illustrative embodiment. Nanotube 110, which has a length greater than 100 nm, operates in the far-infrared (THz) range. Nanotube 120, which has a length greater than 50 nm and less than 100 nm, operates in the mid-infrared range. Nanotube 130, which has a length less than 50 nm, operates in the near-infrared range. The plasmon resonances will be blue-shifted (e.g., an increase in frequency and a decrease in wavelength) into the near-infrared spectral range (e.g., from the mid-infrared range). The blue-shifting is based on the f~1/L relationship of a one-dimensional (1D) plasmon resonator, wherein f is the resonator's frequency, and L is its length (as shown in FIG. 1).

According to the present disclosure, there are other optical properties that can be exhibited when carbon nanotubes are etched into lengths of less than 50 nm. For example, the carbon nanotube dots can display quantum size effects that modify their optical properties, including but not in any way limited to shifting their exciton emission and absorption energies. In addition, the carbon nanotube dots can function as single-photon sources in terms of the timing statistics of their emitted photons. The plasmon resonance of the individual carbon nanotubes may hybridize with the exciton resonance, leading to plasmon-exciton polaritons. The emission energy and/or intensity can be electrically gated with a back or a top gate.

By virtue of the teachings herein, the present disclosure provides an improvement in the function of polariton devices and structures having polariton quantum dots. The teachings of the present disclosure have a wide variety of applications, including but not limited to:

(1) Single-photon sources for quantum communication devices and linear optical quantum computing.
(2) Tunable emitters or absorbers, where the tuning can come from electrostatic gating of the nanotube plasmon resonance, electrostatic gating of the nanotube exciton resonance, a modification of the plasmon-exciton couple strength (e.g., through electrostatics).
(3) Radiative emission from proximate emitters external to the nanotube (e.g., within 2 nm) will be enhanced according to the Purcell effect.
(4) Nonlinear optical effects such as four-wave mixing can be enhanced due to the dispersion resulting from the strong plasmon-exciton interactions.

Additional advantages of the present disclosure are disclosed herein.

EXAMPLE EMBODIMENTS

Figure 2:
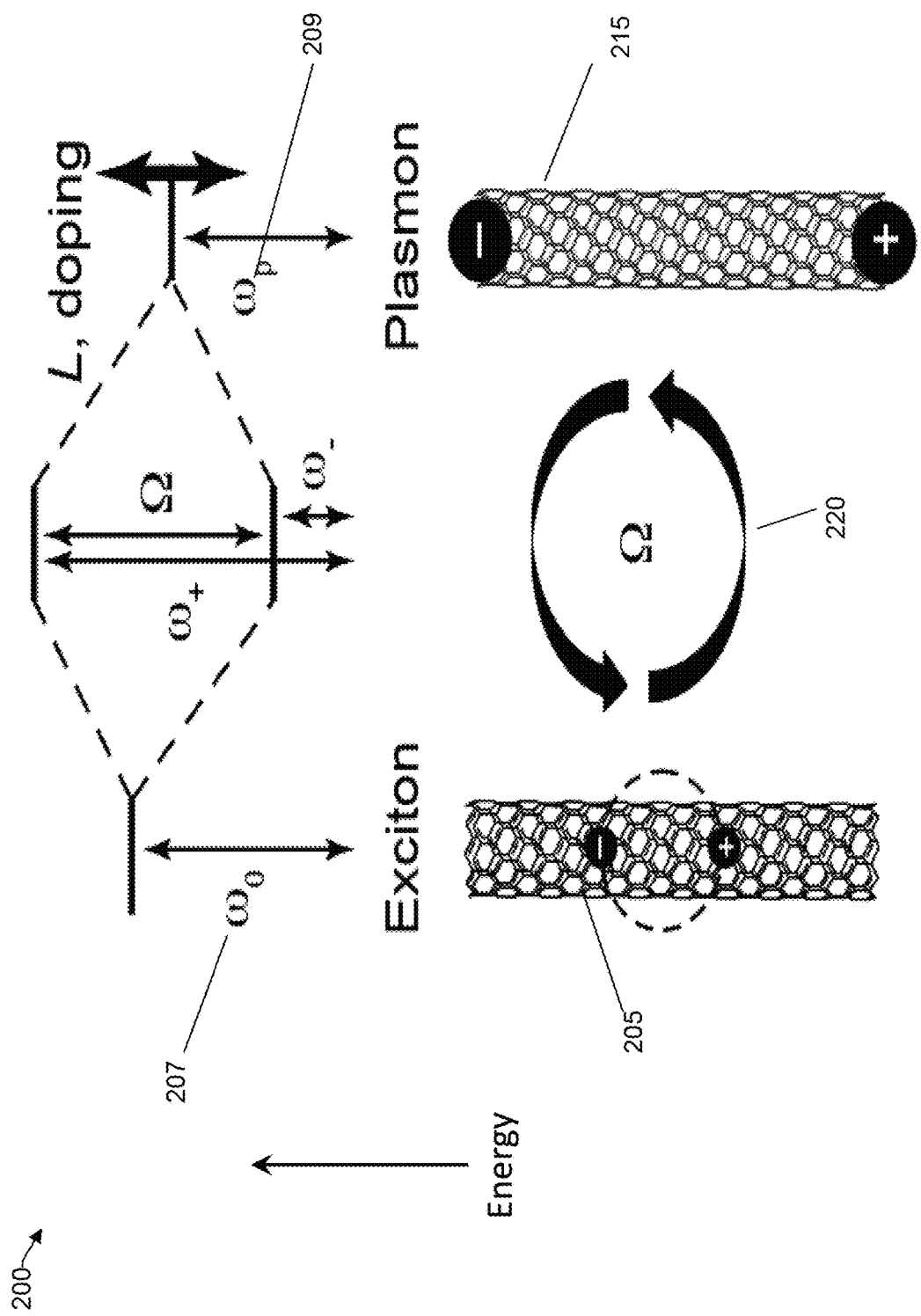
FIG. 2 is an illustration of how nanotube excitons couple to plasmons, consistent with an illustrative embodiment.

FIG. 2 is an illustration 200 of how nanotube excitons 205 couple to plasmons 215, consistent with an illustrative embodiment. The bare (e.g., uncoupled) plasmon has an energy $\omega_P$ 209. The exciton 205 has a strength $\omega_O$ 207. The coupling strength between the exciton 205 and the plasmon 215 is characterized by Rabi splitting $\Omega$ 220. Coupling between the plasmon 215 and exciton 205 leads to polaritons of mixed plasmon-exciton character, whose energies are $\omega_+$ and $\omega_-$.

Figure 3:
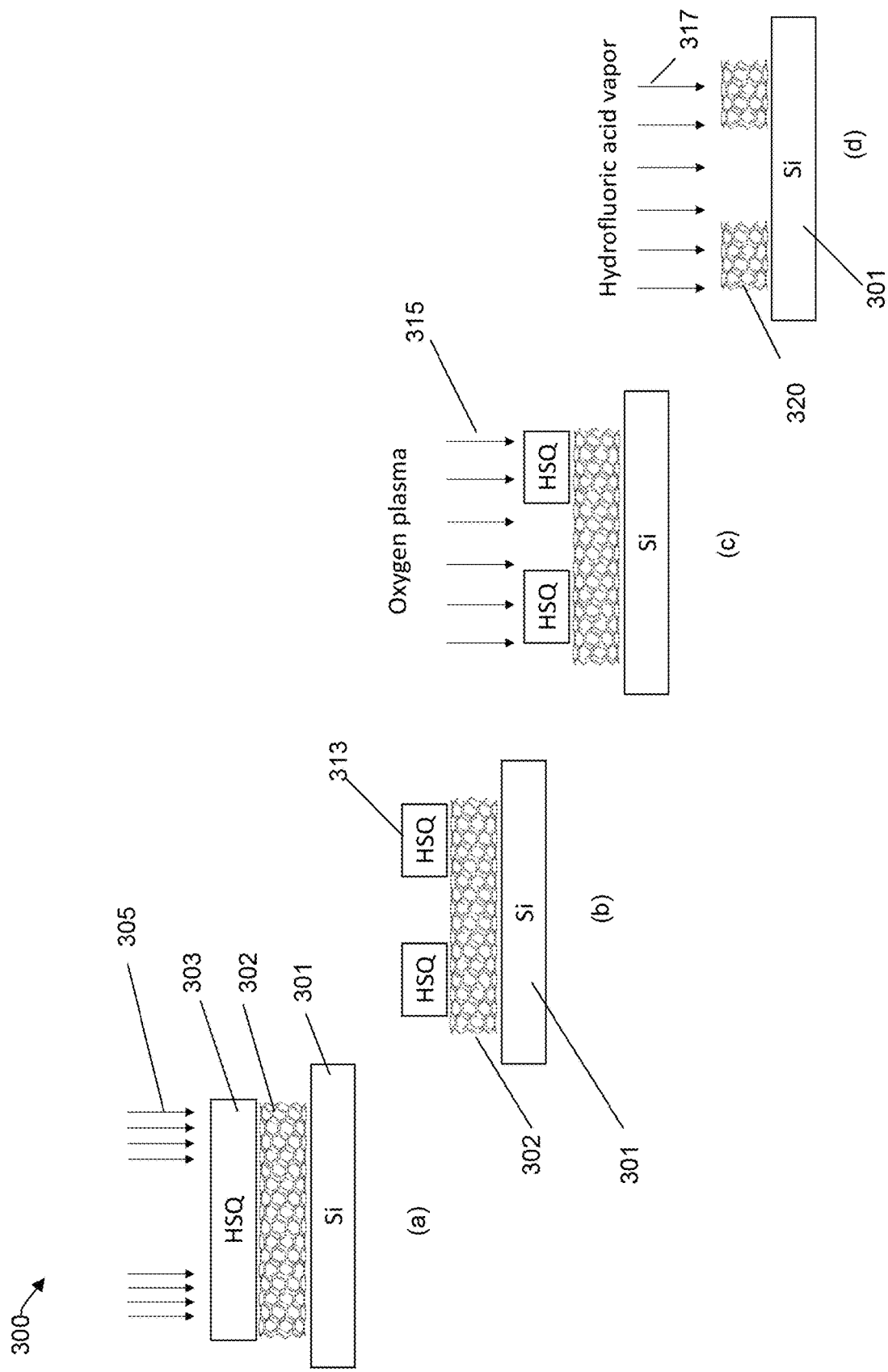
FIG. 3 is an illustration of the fabrication stages of a carbon nanotube dot, consistent with an illustrative embodiment.

FIG. 3 is an illustration 300 of the fabrication stages of carbon nanotube dots, consistent with an illustrative embodiment. In this illustration, the first through fourth stages (a), (b), (c), and (d) are shown. In stage (a), a carbon nanotube 302 is resting a substrate 301. Electron beams 305 are applied to an electron beam resist 303 to draw a pattern. The electron beam resist 303 used can be, for example, hydrogen silsesquioxane (HSQ). Stage (b) shows a patterned electron beam resist 313 (e.g., HSQ pattern) after the application of the electron beams. At stage (c), oxygen plasma 315 is applied to transfer the HSQ pattern 313 to the nanotube 302, and at stage (d) hydrofluoric acid and/or hydrofluoric acid vapor 317 is used to strip the electron beam resist. Quantum dot nanotubes 320 are produced at stage (d).

Figure 4:
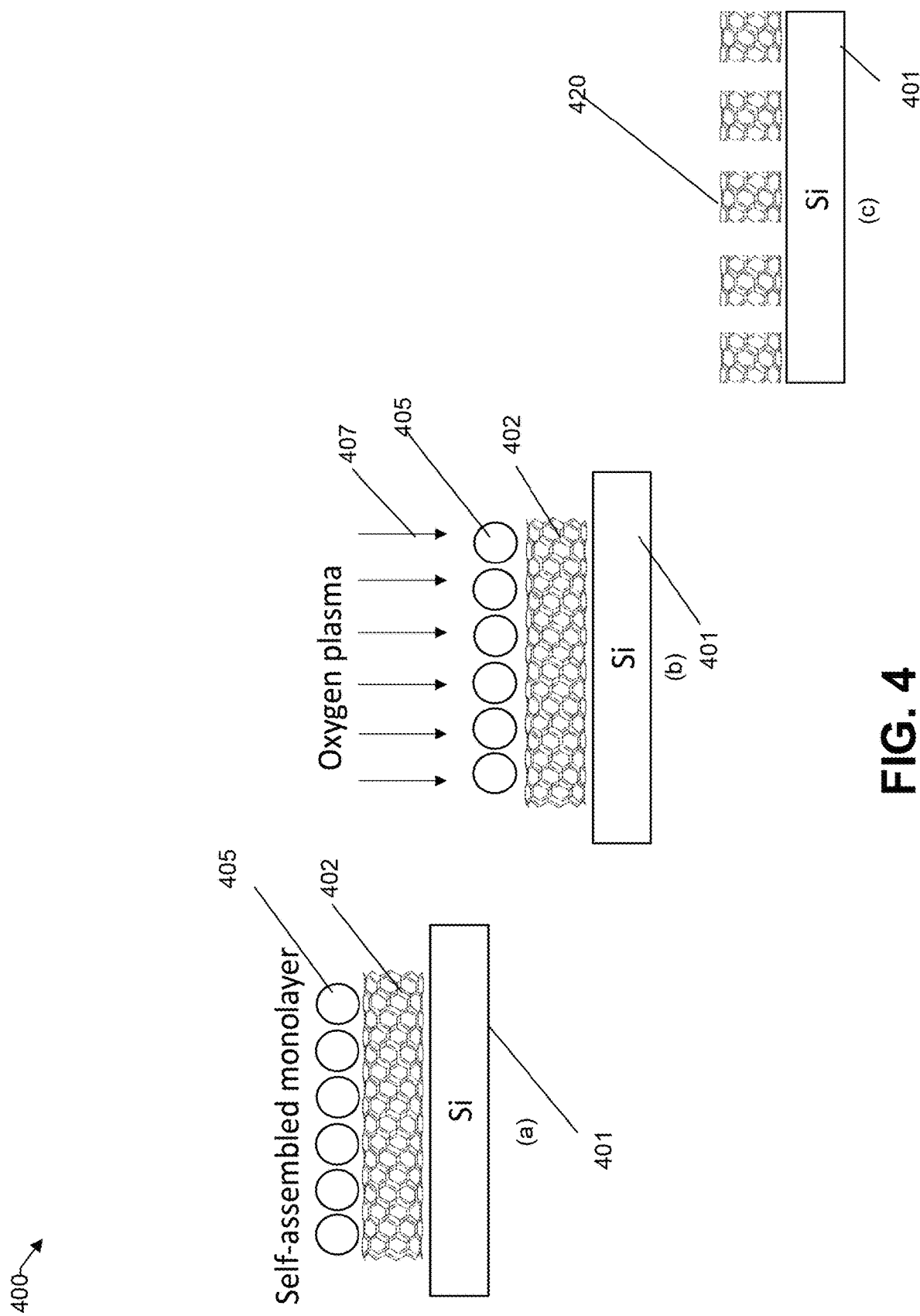
FIG. 4 illustrates a self-assembled monolayer used as a mask for patterning carbon nanotubes, consistent with an illustrative embodiment.

FIG. 4 illustrates a self-assembled monolayer 400 used as a mask for patterning carbon nanotubes, consistent with an illustrative embodiment. FIG. 4 is an alternative to the construction shown in FIG. 3. In stage (a), a carbon nanotube 402 is shown resting on a substrate 401. The self-assembled monolayer 405 is arranged on the carbon nanotube. The self-assembled monolayer 405 can be formed of materials including but not limited to arrays of gold nanoparticles, polymers, and silanes such as octadecyl trichlorosilane. At stage (b), oxygen plasma 407 can be applied to the self-assembled monolayer 405 mask. At stage (c), quantum dots 420 are shown on the substrate 401.

Figure 5B:
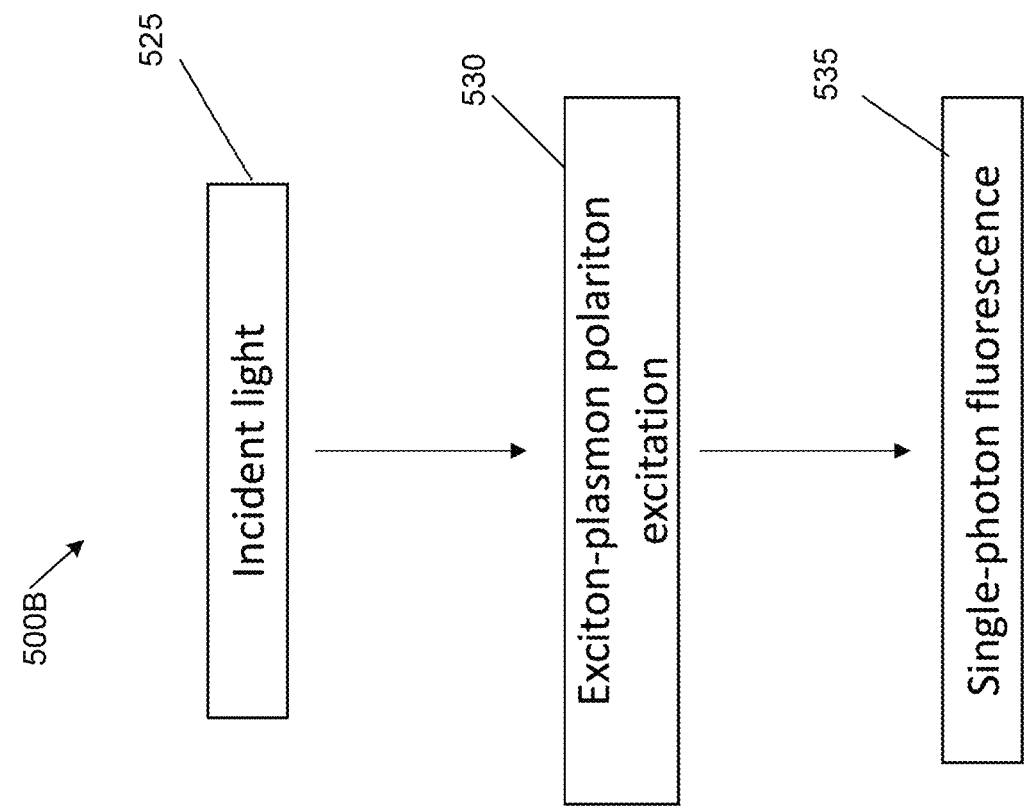
FIG. 5B shows the sequence of operations of the nanotube polariton quantum dot shown in FIG. 5A, consistent with an illustrative embodiment.
Figure 5A:
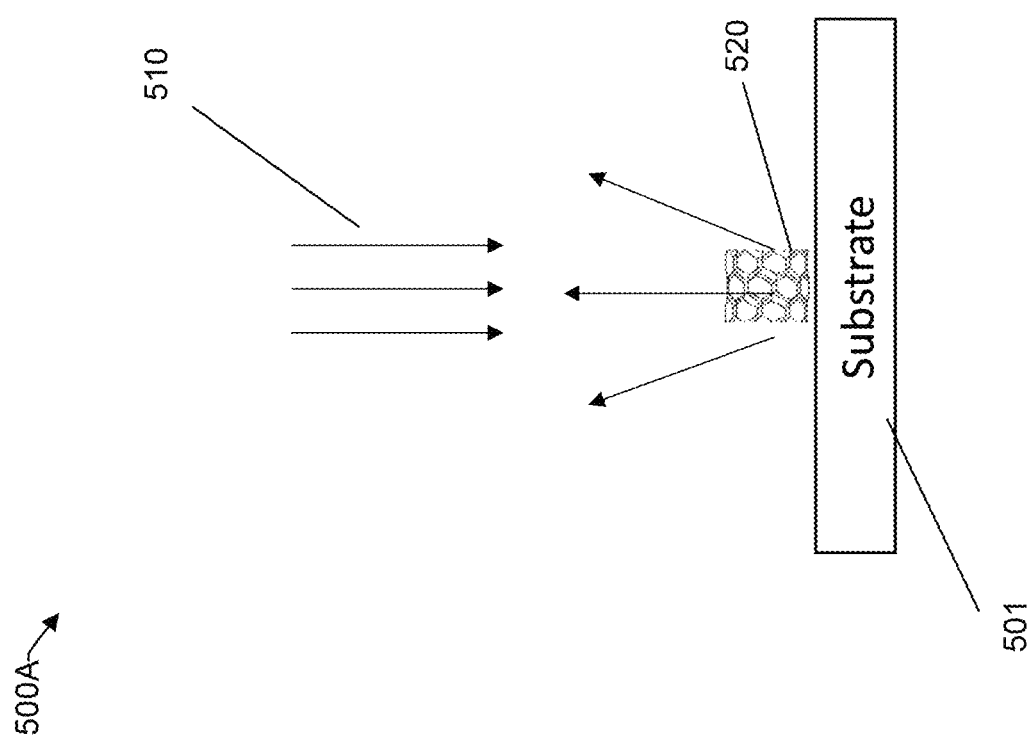
FIG. 5A illustrates a nanotube polariton quantum dot, consistent with an illustrative embodiment.

FIG. 5A illustrates a nanotube polariton quantum dot 500A, consistent with an illustrative embodiment, the nanotube polariton quantum dot includes an ultrashort nanotube 520 (L<50 nm) is resting on a substrate 501. A light source 510 such as a laser is used to optically excite the nanotube quantum dot. FIG. 5B shows the sequence of operations 500B of the nanotube polariton quantum dot shown in FIG. 5A. An incident light 525 is directed at the ultrashort nanotube 520 resting on the substrate 501. Exciton-plasmon polariton excitation 530 occurs from the interaction of the incident light on the ultrashort nanotube, which in turn creates a single-photon fluorescence 535 emission.

FIG. 5C illustrates a nanotube polariton quantum dot 500C consistent with an illustrative embodiment. An ultrashort nanotube 555 (L<50 nm) is shown resting on a substrate 570 having an LED 575 and a dielectric 580. A filter 560 is arranged above the quantum dot to absorb incident light from the LED 575 The nanotube emission is transmitted through the filter 560. FIG. 5D shows the sequence of operations 500D of the nanotube polariton quantum dot shown in FIG. 5C. An incident light 585 from the LED causes exciton-plasmon polariton excitation 590, and the emission of a single-photon fluorescence 595 by the ultrashort nanotube 555.

Figure 6B:
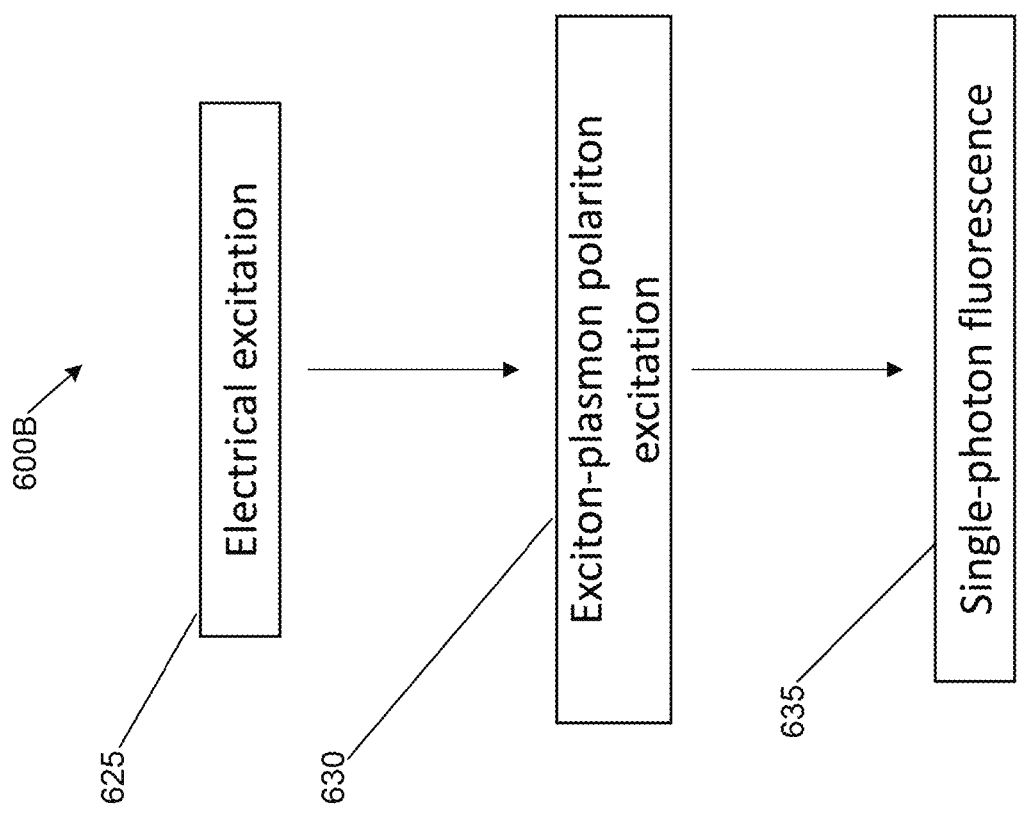
FIG. 6B shows the sequence of operations of the nanotube polariton quantum dot shown in FIG. 6A, consistent with an illustrative embodiment.
Figure 6A:
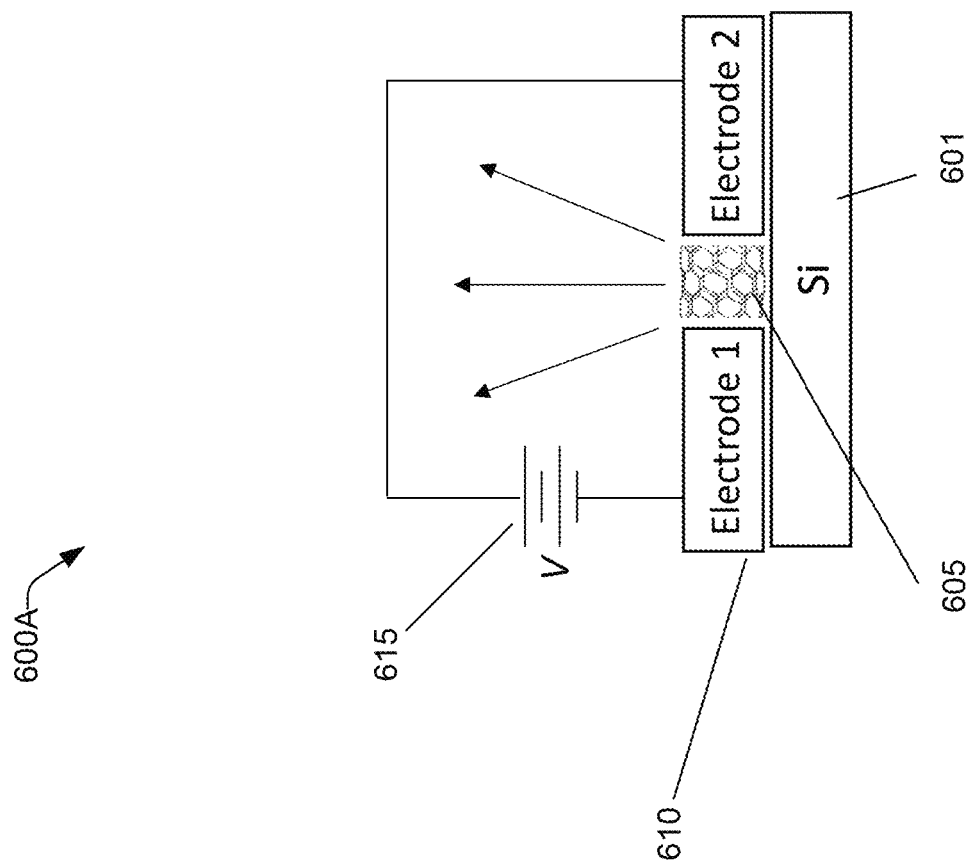
FIG. 6A illustrates a nanotube quantum dot with a single-photon source, consistent with an illustrative embodiment.

FIG. 6A illustrates a nanotube quantum dot 600A with a single-photon source, consistent with an illustrative embodiment. An ultrashort nanotube 605 is connected between two contacts 610 (e.g., electrode 1 and electrode 2). The contacts 620 are connected through an external circuit to a voltage source 615 (or a current source). Single photons are emitted through the process of electro-luminescence when the voltage source 615 (or current source) is pulsed. FIG. 6B shows the sequence of operations 600B of the nanotube polariton quantum dot shown in FIG. 6A, consistent with an illustrative embodiment. There is an electrical excitation 625 of the nanotube by the voltage source 615 (or current source) via the electrodes 610. An exciton-plasmon polariton excitation 630 occurs by the application of the electrical excitation. A single-photon fluorescence is emitted by the ultrashort nanotube 605.

Figures 6C, 6D:
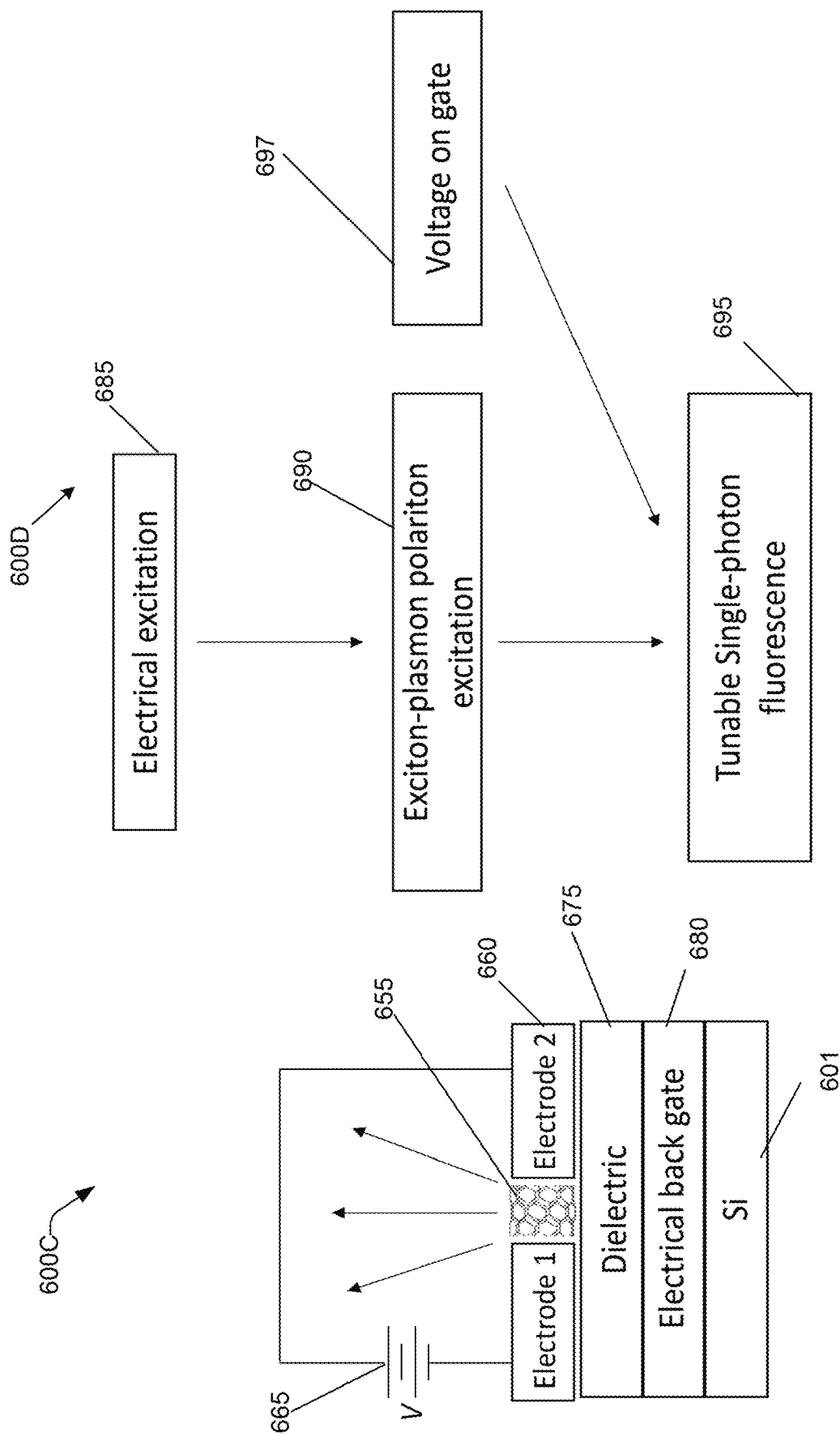
FIG. 6C illustrates a nanotube quantum dot with a tunable single-photon source, consistent with an illustrative embodiment.
FIG. 6D shows the sequence of operations of the nanotube polariton quantum dot shown in FIG. 6C, consistent with an illustrative embodiment.

FIG. 6C illustrates a nanotube quantum dot 600C with a tunable single-photon source, consistent with an illustrative embodiment. An ultrashort nanotube 655 is connected between two contacts 660 (e.g., electrode 1 and electrode 2). A substrate 601 has an electrical back gate 680 and a dielectric layer 675 thereon. The electrical back gate 680 can be capacitively coupled to the nanotube 655 by the dielectric 675. A voltage applied to the electric back gate 680 will change the charge density in the nanotube 655. Changing the charge density in the nanotube 655 serves to tune the emission frequency of the nanotube 655 and to change the degree to which the nanotube polariton dot has a plasmonic character or an excitonic character, which in turn can tune the degree of absorption in the nanotube 655. FIG. 6D shows the sequence of operations 600D of the nanotube polariton quantum dot shown in FIG. 6C, consistent with an illustrative embodiment. There is an electrical excitation 685 of the nanotube 655 that creates an exciton-plasmon polariton excitation 690. A tunable single-photon fluorescence 695 can be tuned by the voltage applied 697 to the gate.

Figure 7:
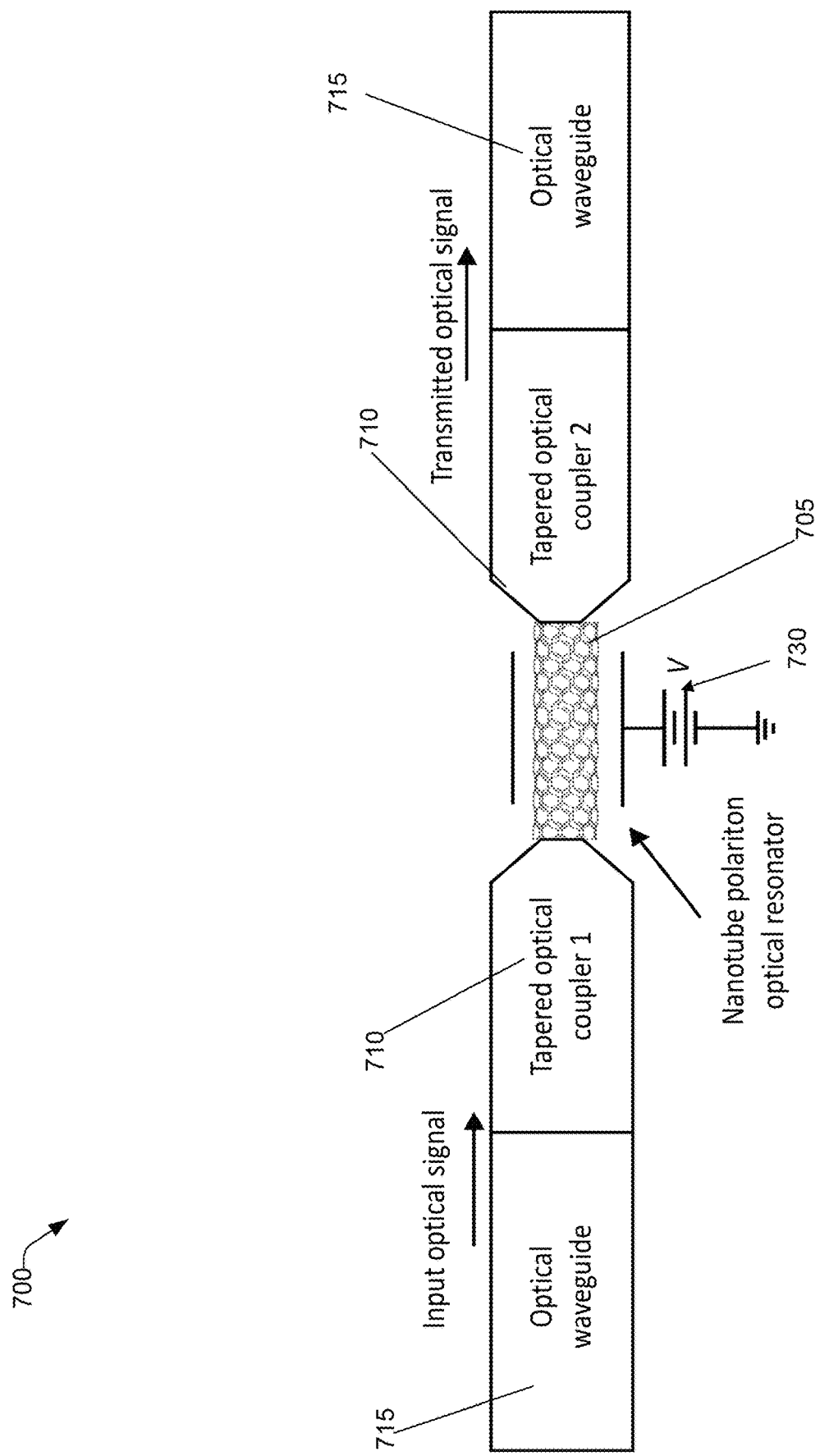
FIG. 7 illustrates a carbon nanotube quantum dot coupled to tapered metallic couplers, consistent with an illustrative embodiment.

FIG. 7 illustrates a carbon nanotube quantum dot 700 coupled to tapered metallic couplers, consistent with an illustrative embodiment. The nanotube 705 is coupled to tapered metallic optical couplers 710 at each end. With the coupling of optical waveguides 715 to the tapered optical couplers 710, the construction provides for the transmission of light through the carbon nanotube 705. The carbon nanotube 705 can be electrostatically gated with a voltage 730, and can be used for nonlinear optical devices.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, operations, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

The flowchart, and diagrams in the figures herein illustrate the architecture, functionality, and operation of possible implementations according to various embodiments of the present disclosure.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any such actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A nanotube polariton quantum dot photon source device, comprising:
    a substrate;
    a nanotube arranged on the substrate; and
    an incident light source configured to generate an exciton-plasmon polariton excitation in the nanotube and emit a photon, wherein the nanotube has a length L<50 nm to emit one or more photons at a desired frequency.

2. The device according to claim 1, wherein the desired frequency comprises an infrared frequency.

3. The device according to claim 2, wherein the desired frequency comprises a near-infrared frequency.

4. The device according to claim 1, wherein a diameter of the nanotube is about 1.5 nm.

5. The device according to claim 1, wherein the incident light source comprises a laser arranged above a surface of the substrate on which the nanotube is arranged.

6. The device according to claim 1, wherein the incident light source comprises a light emitting diode (LED) fabricated on a surface of the substrate; and
    a filter arranged above a surface of the substrate on which the nanotube is arranged, wherein the filter is configured to absorb incident light emitted from the LED and to pass a photon emission from the nanotube during an exciton-plasmon polariton excitation.

7. The device according to claim 6, wherein the LED is arranged below the nanotube.

8. The device according to claim 1, wherein the photon emission from the nanotube comprises a single-photon fluorescence.

9. The device according to claim 7, further comprising a dielectric layer arranged on the substrate and capacitively coupled to one end of the nanotube.

10. A nanotube polariton quantum dot photon source device, comprising:
    a substrate;
    a nanotube arranged on the substrate; and
    one or more electrodes connected to the nanotube,
    wherein the nanotube has a length L<50 nm and is configured to emit a single-photon fluorescence in response to the electrodes receiving a pulsed voltage or current.

11. The device according to claim 10, wherein the nanotube is configured to emit single photons by electroluminescence when a pulsed voltage or a pulsed current is applied to the one or more electrodes.

12. The device according to claim 10, wherein:
    the one or more electrodes comprise a first electrode and a second electrode;
    a first substantially radial end of the nanotube is arranged on a surface of the substrate;
    the nanotube is connected to each of the first electrode and the second electrode;
    the first electrode and the second electrode are configured to receive a voltage or a current via an external circuit.

13. The device according to claim 10, wherein:
    the one or more electrodes comprise a first electrode and a second electrode;
    the nanotube is connected to each of the first electrode and the second electrode;
    an electrical gate is arranged on the substrate and configured to receive an applied voltage, and a dielectric layer is arranged on the electrical gate; and
    the nanotube is capacitively coupled to the electrical gate via the dielectric.

14. The device according to claim 13, wherein an emission frequency of the nanotube is tuned based on an amount of voltage applied to the electrical gate.

15. The device according to claim 13, wherein a change in a degree of absorption of the nanotube is based on an amount of the voltage applied to the electrical gate.

16. The device according to claim 13, wherein a charge density in the nanotube is changed based on an amount of voltage applied to the electrical gate.

17. The device according to claim 13, wherein a degree to which the nanotube exhibits a plasmonic character or an excitonic character is based on an amount of voltage applied to the electrical gate.

18. The device according to claim 10, further comprising an array of nanotubes arranged on the substrate.

19. A carbon nanotube dot quantum device, comprising:
a nanotube polariton optical resonator having two ends and a length less than 50 nm;
a pair of tapered optical couplers, wherein each optical coupler is connected at a tapered end to a respective one of the two ends of the nanotube polariton optical resonator; and
a pair of optical waveguides, wherein each waveguide is coupled to a non-tapered end of one tapered optical coupler, respectively.

20. The carbon nanotube dot quantum device according to claim 19, wherein:
an electrostatic gate voltage is coupled to the nanotube polariton optical resonator; and
the tapered optical couplers are metallic.

\* \* \* \* \*